United States Patent
Suzumura et al.

(10) Patent No.: US 9,264,070 B2
(45) Date of Patent: Feb. 16, 2016

(54) MEMORY CONTROLLER, MEMORY SYSTEM, AND MEMORY WRITE METHOD

(71) Applicants: Tatsuhiro Suzumura, Kanagawa (JP); Akira Yamaga, Kanagawa (JP)

(72) Inventors: Tatsuhiro Suzumura, Kanagawa (JP); Akira Yamaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/685,296

(22) Filed: Nov. 26, 2012

(65) Prior Publication Data
US 2013/0173997 A1    Jul. 4, 2013

(30) Foreign Application Priority Data

Dec. 28, 2011    (JP) .................................. 2011-289128

(51) Int. Cl.
*G11C 29/00*    (2006.01)
*H03M 13/03*    (2006.01)
*G06F 11/10*    (2006.01)

(52) U.S. Cl.
CPC ........... *H03M 13/03* (2013.01); *G06F 11/1048* (2013.01)

(58) Field of Classification Search
CPC .................... G06F 11/1048; H03M 13/03
USPC .................................. 714/773, 776
See application file for complete search history.

(56) References Cited

U.S. PATENT DOCUMENTS

| 8,458,572 B1* | 6/2013 | Vlaiko ......................... 714/776 |
| 2002/0184592 A1* | 12/2002 | Koga et al. ................... 714/763 |
| 2011/0126079 A1* | 5/2011 | Wu et al. ....................... 714/763 |

FOREIGN PATENT DOCUMENTS

| JP | 2006-195990 | 7/2006 |
| JP | 2011013736 A | 1/2011 |
| JP | 2011-180831 | 9/2011 |
| JP | 2011180831 A | 9/2011 |

OTHER PUBLICATIONS

Japanese Office Action for JP Application No. 2011-289128, dated Aug. 26, 2014.
Japanese Office Action for Japanese Application No. 2011-289128 dated Mar. 24, 2015.

* cited by examiner

*Primary Examiner* — Sam Rizk
(74) *Attorney, Agent, or Firm* — Patterson & Sheridan, LLP

(57) ABSTRACT

A memory controller includes a memory interface that has multiple channels and carries out writing into a nonvolatile memory through each of the channels, a data buffer, an ECC (error correcting code) encoder for applying an error correction encoding processing on write data which are to be written into the nonvolatile memory to generate ECC data, a channel allocation part for allocating the channels to the write data and the ECC data based on a write data format of the nonvolatile memory, a write data reception processing part that stores the write data in the data buffer and outputs the write data to the ECC encoder, and a channel scheduler for transferring the write data stored in the data buffer and the ECC data to the channels of the memory interface as allocated by the channel allocation part.

14 Claims, 7 Drawing Sheets

Fig. 6

| CH#1 | CH#2 | CH#3 | CH#4 |
|---|---|---|---|
| Host-D | Host-D | Host-D | Host-D |
| Host-D | Host-D | Host-D | ECC-D |

Fig. 7

| CH#1 | CH#2 | CH#3 | CH#4 |
|---|---|---|---|
| Host-D | Host-D | Host-D | Host-D |
| Host-D | Host-D | Host-D | Host-D |
| Host-D | Host-D | Host-D | Host-D |
| Host-D | Host-D | Host-D | ECC-D |

Fig. 8

| CH#1 | CH#2 | CH#3 | CH#4 | |
|---|---|---|---|---|
| Host-D | Host-D | Host-D | Host-D | U1 |
| Host-D | Host-D | Host-D | ECC-D | U2 |

| | CH#1 | CH#2 | CH#3 | CH#4 |
|---|---|---|---|---|
| | Host-D | Host-D | Host-D | Host-D |
| | Host-D | Host-D | Host-D | ECC-D |
| | Host-D | Host-D | Host-D | Host-D |
| | Host-D | Host-D | Host-D | ECC-D |

MEMORY CONTROLLER, MEMORY SYSTEM, AND MEMORY WRITE METHOD

CROSS-REFERENCE TO RELATED APPLICATION

This application is based upon and claims the benefit of priority from Japanese Patent Application No. 2011-289128, filed Dec. 28, 2011; the entire contents of which are incorporated herein by reference.

FIELD

Embodiments described herein relate generally to a memory controller, a memory system, and a memory write method.

BACKGROUND

SSD (solid state drive) systems generally use NAND flash memory (hereinafter, referred to as NAND memory) to store data and redundant data in the form of error correcting codes for reliability. A memory controller of SSD systems has several channels and performs reading and writing of NAND memory, in parallel, across the channels. Generally, each channel corresponds to one memory chip of the NAND memory.

DESCRIPTION OF THE DRAWINGS

FIG. 6 shows an example of a data format in the case where a write unit and an error correction unit are matched.

FIG. 7 shows another example of a data format in the case where a write unit and an error correction unit are matched.

FIG. 8 shows an example of a data format in the case where a write unit is smaller than an error correction unit.

DETAILED DESCRIPTION

According to an embodiment, there is provided a memory controller, a memory system, and a memory write method that can improve channel utilization efficiency and a write speed.

In general, according to one embodiment, there is provided a memory interface that has several channels and carries out writing to a nonvolatile memory through each channel, a data buffer, an error correcting code (ECC) encoder for generating redundant data in the form of ECC based on write data, a channel allocation part for allocating the channels to the write data and the redundant data based on a write data format, a write data reception processing part that stores the write data in the data buffer and inputs the write data into the ECC encoder, and a channel scheduler for transferring the write data and the redundant data stored in the data buffer, based on the channel allocation result, to the memory interface.

In an SSD system having several channels, to be able to restore data when a memory chip unit is faulty, ECC is sometimes introduced between channels. In this SSD system, write data for which ECC is generated are written after waiting for the alignment of the write data.

For this reason, either (1) a method that generates and writes the ECC data, or (2) a method that writes the ECC data while generating, can be adopted. In method (1), even if the write data are aligned, write data that is a source for generating ECC data cannot be written into NAND memory until the generation of the ECC data is finished. Therefore, write speed is lowered.

In the method (2), since the ECC data and the transmission of ECC data are both managed by transferring data to NAND memory according to an order of input for ECC data generation processing, writing to NAND memory is applied after waiting for vacating of all the channels related to the ECC data (all the channels for writing the ECC data and the write data corresponding to the ECC data). For this reason, for each channel, a vacant time is generated, causing inefficiency. In addition, the channel to be written to is not released until writing of the ECC data and all the write data related to the ECC data, is finished. Therefore, even if a read command having priority is generated, the corresponding channel is in use, and the non-interruptible probability rises, reducing the performance of the entire system.

Next, the memory controller, the memory system, and the memory write method of an embodiment will be explained in detail with reference to the attached figures. The present disclosure is not limited by this embodiment.

Figure 1:
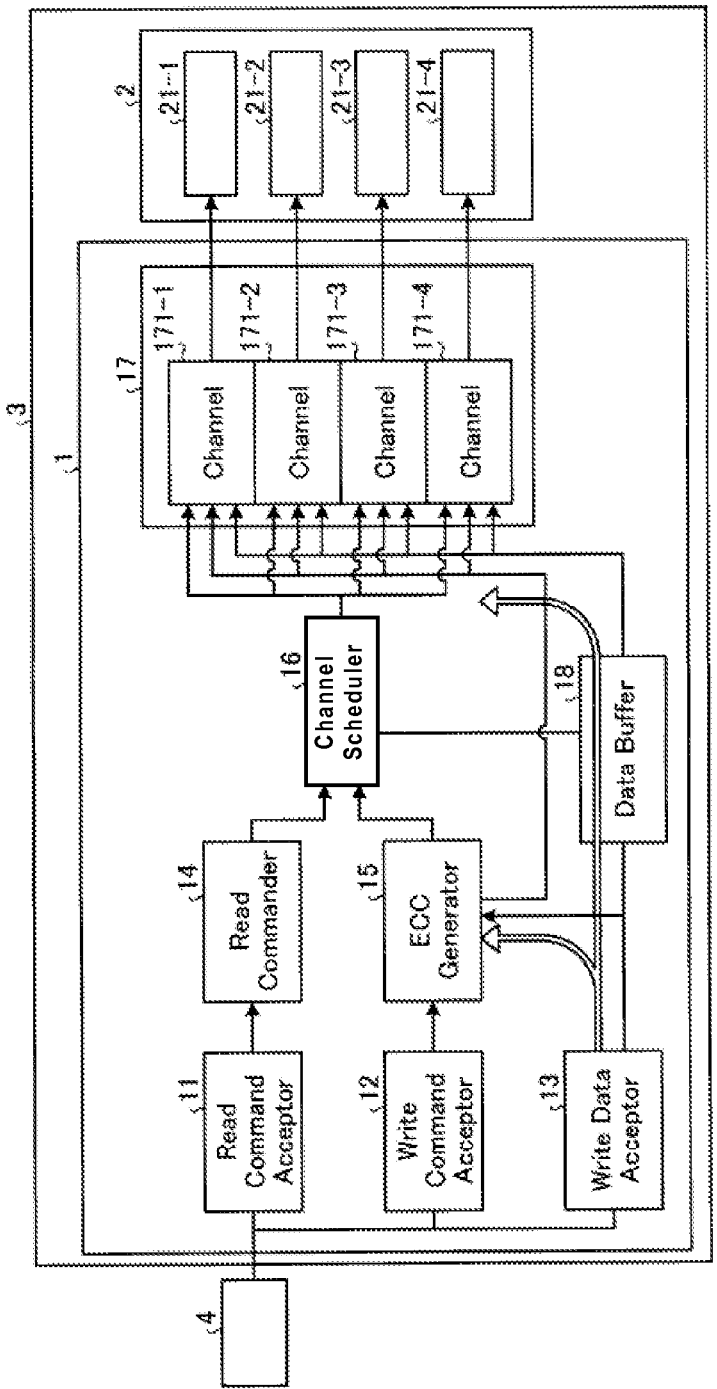
FIG. 1 is a block diagram showing a memory system according to an embodiment.

FIG. 1 is a block diagram showing a memory system according to an embodiment. As shown in FIG. 1, a memory system 3 is provided with a memory controller 1 and NAND memory (nonvolatile memory) 2. The memory system 3 is connectable with a host 4, and FIG. 1 shows a connected state with the host 4. The host 4 is, for example, an electronic appliance such as a personal computer and portable terminal.

The NAND memory 2 is a nonvolatile memory for storing data in a nonvolatile fashion and includes four memory chips (memories 21-1 to 21-4). The number of memory chips constituting the NAND memory 2 is four in this example; however the number of memory chips is not limited to this. In addition, an example is explained in which the NAND memory 2 is used as nonvolatile memory; however storage means other than the NAND memory may also be used.

The memory controller 1 controls writing into the NAND memory 2 according to a write request (write command) from the host 4 and controls reading from the NAND memory 2 according to a read request (read command) from the host 4. The memory controller 1 is configured with a read command reception processing part (read command acceptor) 11, write command reception processing part (write command acceptor) 12, write data reception processing part (write data acceptor) 13, read command issue part (read commander) 14, error correction code generation part (ECC generator) 15, channel scheduler 16, NAND I/F (memory interface) 17, and data buffer 18.

The NAND I/F 17 is a controller for directly controlling writing or reading into or from the NAND memory 2. The NAND I/F 17 has channel control parts 171-1 to 171-4 corresponding to the number of memory chips, and channel control parts 171-1 to 171-4 control writing into or reading from each corresponding memory 21-1 to 21-4. The channel control parts 171-1 to 171-4 can carry out writing into or reading from the NAND memory 2 in parallel. Here, the NAND I/F 17 has four channels in accordance with the number of memory chips of the NAND memory 2; however if the number of memory chip is other than four, the controller may have the same number of channels as the number of memory chips. Hereinafter, the channels corresponding to the channel control parts 171-$i$ ($i$=1, 2, 3, or 4) are indicated by CH#$i$.

If a read request including an address of data to be read is received from the host 4, the read command reception processing part 11 notifies the read command issue part 14 of the read request. The read command issue part 14 converts the address of the data to be read, which has been requested from the host 4, into an address on the NAND memory, issues a read command including the converted address, and notifies the channel scheduler 16.

If a write command including an address of write data is received from the host 4, the write command reception processing part 12 sends the write command and the address of the write data to the error correction code generation part 15. After receiving the write data from the host 4, the write data reception processing part 13 inputs the data into the error correction code generation part 15 and stores the data in the data buffer 18.

The error correction code generation part 15 allocates channels to the write data and applies an error correction coding processing based on the channel allocation result and the input write data. In this embodiment in which the data are distributed and arranged in several channels (the data are distributed and stored in several memory chips), the ECC between pages is applied. In addition, based on the channel allocation result, the error correction code generation part 15 issues a write command including an address on the NAND memory 2 corresponding to the write data to the channel scheduler 16.

The channel scheduler 16 instructs the channel control parts 171-1 to 171-4 corresponding to the memories 21-1 to 21-4, in which the data to be read are stored, to read the relevant data based on the read command issued from the read command issue part 14. In addition, the channel scheduler 16 transfers the write data stored in the data buffer 18 to the channel control parts 171-1 to 171-4 of the NAND I/F 17 corresponding to the write data based on the write command issued from the error correction code generation part 15.

FIG. 1 shows a flow of the write data of this embodiment by a block arrow. In this embodiment, as shown by the block arrow of FIG. 1, the write data are input into the error correction code generation part 15 and also transferred to the NAND I/F 17 via the data buffer 18.

To explain the write processing into the NAND memory 2, a write direction arrow is indicated for the flow of the data in FIG. 1. For read processing, the data flow is in an opposite direction (the direction from the NAND memory 2 toward the memory controller 1). In one embodiment of the read processing, the data and the error correction code read out of the NAND memory 2 are stored in the data buffer 18 by the channel control parts 171-1 to 171-4, and after error correction processing the data are transferred to the host 4.

Figure 2:
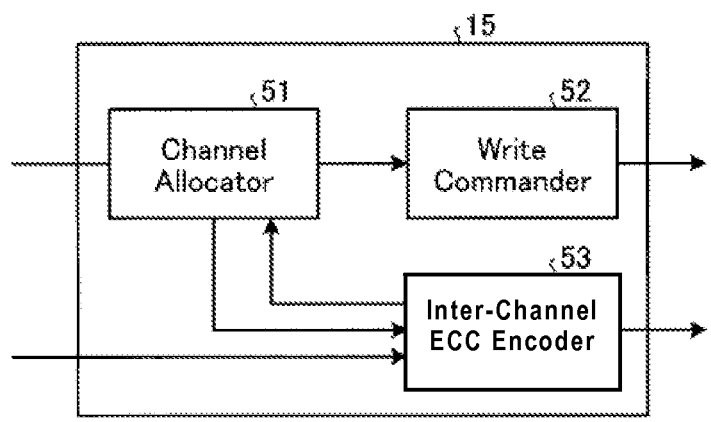
FIG. 2 is an example of an error correction code generation part.

The write processing of this embodiment will next be explained in detail. FIG. 2 is an example of the error correction code generation part 15 of this embodiment. As shown in FIG. 2 the error correction code generation part 15 of this embodiment is provided with a channel allocation part (channel allocator) 51, write command issue part (write commander) 52, and ECC encoder between channels (inter-channel ECC encoder) (ECC encoder) 53.

Figure 3:
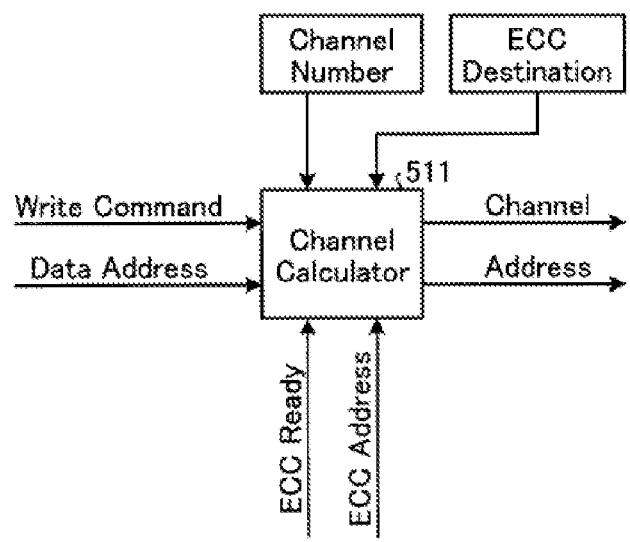
FIG. 3 shows an example of a channel allocation part.

FIG. 3 shows an example of the channel allocation part 51. As shown in FIG. 3, the channel allocation part 51 is provided with a channel calculation part (channel calculator) 511. If a write command is received from the write command reception processing part 12, the channel calculation part 511 calculates channels, which are allocated to the write data (addresses of the write data), and addresses on the NAND memory 2 based on the number of the channel (channel number) and the arrangement of error correction codes (ECC destination), and outputs the channels and the address as allocation information (allocation result) to the write command issue part 52. In addition, after receiving the ECC generation notification (ECC ready), the channel calculation part 511 calculates the channels, which are allocated to the ECC data, and the addresses on the NAND memory 2, and outputs them as allocation information to the write command issue part 52.

The arrangement of the error correction codes indicates a data format when data are stored in the NAND memory 2 and shows a rule for determining storage positions on the NAND memory 2 of the error correction codes and write data corresponding to the error correction codes. An error correction code and the write data corresponding to the error correction code are called error correction unit data, and the unit size of the error correction unit data is called an error correction unit. The error correction codes are arranged in a write area of the NAND memory 2 into which the error correction unit data are written. For example, in the case that the channel number is four when one error correction code of one page is generated based on data of three pages, the error correction unit data are four pages. If the write data in one error correction unit data are distributed to each channel page by page, one of channels (CH#1 to CH#4) is a channel for writing the error correction code, and the other channels are channels for writing the write data. This arrangement of the error correction codes includes information on the designation of a certain channel for writing the write data of three pages, and information on the designation of a certain channel for writing the error correction codes. The channel for writing the error correction codes among the channels (CH#1 to CH#4) may be fixed or may not be fixed. A detailed example of the error correction codes will be given later.

In this embodiment, the inter-channel ECC is applied; however in order for the data input into the error correction code generation part 15 to be distributed and arranged in several channels, it is necessary for the channel allocation part 51 to detect the sequence of data that are input into the error correction code generation part 15. Here, it is assumed that the data are input into the error correction code generation part 15 in the order the data is received by the write data reception processing part 13, and the channel allocation part 51 allocates the channels, assuming that the data are input into the error correction code generation part 15, in the order the data is stored in the data buffer 18. If the sequence of the data received by the write data reception processing part 13 and the sequence of the data, which are input into the error correction code generation part 15, are different, the channel allocation part 51 holds a rule showing the sequence of the data, which are input into the error correction code generation part 15, and allocates the channels based on the rule.

Figure 4:
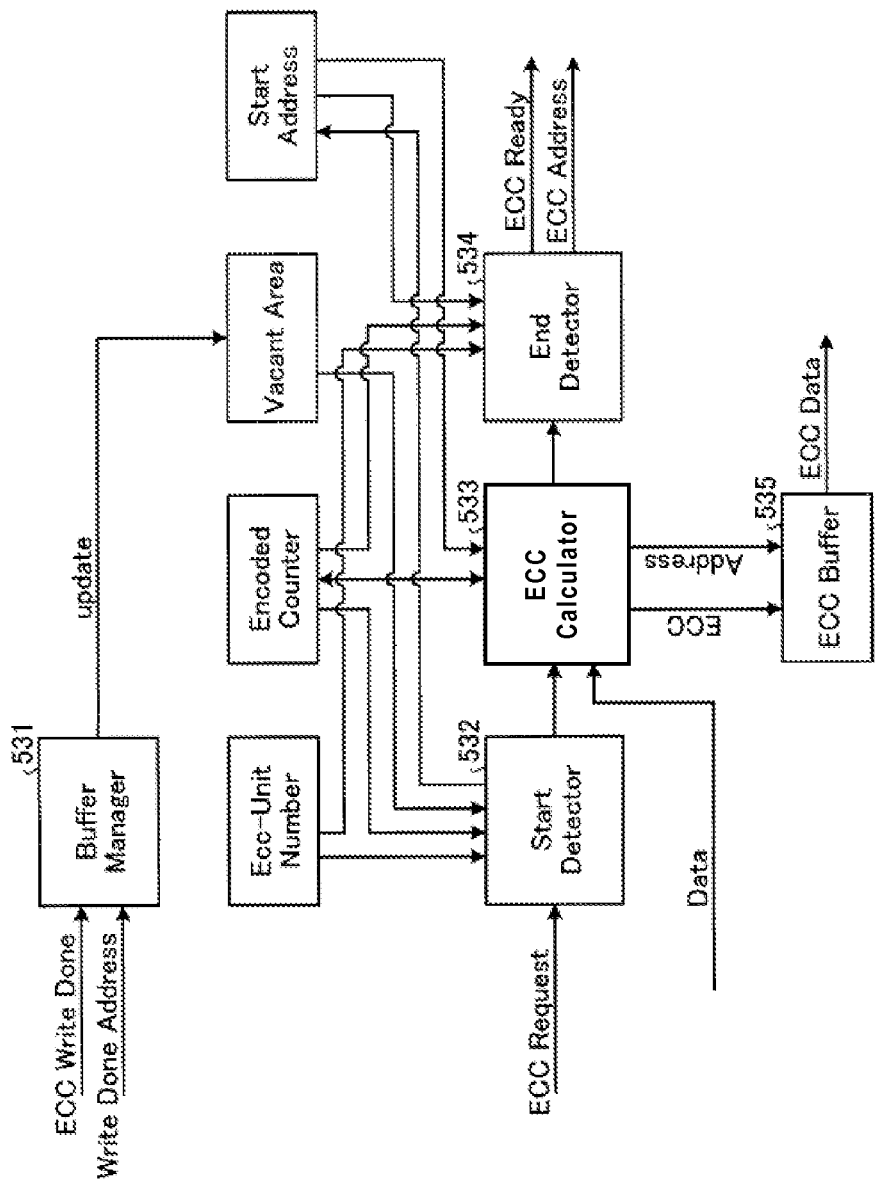
FIG. 4 shows an example of an error correcting code encoder between channels.

FIG. 4 shows a constitutional example of the inter-channel ECC encoder 53. As shown in FIG. 4, the inter-channel ECC encoder 53 is provided with a buffer management part (buffer manager) 531, start detection part (start detector) 532, ECC calculation part (ECC calculator) 533, end detection part (end detector) 534, and ECC buffer (ECC buffer) 535.

The start detection part 532 detects the start position of the error correction unit data, that is, the start of the error correction encoding processing corresponding to one ECC data. If an ECC processing start request (ECC request) from the channel allocation part 51 or write command reception processing part 12 is accepted, the start detection part 532 detects the start of the error correction unit data for inputting write data based on the number of the error correction unit data (ECC-unit number), encoding counter value (encoded counter), and vacant area information (vacant area). If the start of the error correction unit data is detected, the start detection part 532 attains a storage start address (start address of an area for storing generated error correction codes) on the ECC buffer 535 and notifies the ECC calculation part 533 of the storage start address. The number of error correction unit data indicates the size of the write data of the error correction unit data. Here, the size is indicated by number of pages. The encoding counter value is a counter value for counting the number of pages processed by the ECC calculation part 533. The vacant area information indicates a vacant area in the ECC buffer 535.

The ECC calculation part 533 generates redundant data by the error correction encoding processing based on the input write data, designates an address to the ECC buffer 535 (storage start address notified from the start detection part 532) by using the generated redundant data as ECC data, and stores the data in the ECC buffer 535. In addition, the ECC calculation part 533 writes an intermediate state of the encoding processing into the corresponding storage area of the ECC buffer 535, updates the intermediate state each time the input write data are reflected in the encoding processing, and updates the encoding counter value. Moreover, in case the storage start address is notified by the start detection part 532, the ECC calculation part 533 initializes the processing and changes the storage address in the ECC buffer 535 to the notified storage start address. Here, the write data are input as a page unit, and the encoding counter value is updated for each page.

The end detection part 534 detects the end of the error correction encoding processing corresponding to one ECC data for inputting the write data based on the number of the error correction unit data and the encoding counter value. In case the end of the error correction unit data is detected, the end detection part 534 outputs an ECC generation notification (ECC ready) showing the end of the error correction unit data along with the address (ECC address) in the ECC buffer 535, in which error correction unit data are stored, to the channel allocation part 51.

The buffer management part 531 updates the vacant area information of the ECC buffer 535 based on a write completion notification (ECC write done) of the ECC data and the address of the ECC data. In other words, the buffer management part 531 updates the area on the ECC buffer 535, which has received the write completion notification of the ECC data, where the ECC data have been stored, to a vacant area. The write completion notification (ECC write done) of the ECC data may be issued by the channel scheduler 16 or may also be issued by the write command issue part 52.

For example, assuming that the error correction unit data are generated to have write data of three pages and ECC data of one page, when a write processing starts, the start detection part 532 decides that the initial data input is the start of the error correction unit data, and based on the encoding counter value, if an encoding processing of the data of three pages is finished, the end detection part 534 detects the end of the error correction unit data. Next, if the previous error correction unit data are finished, the start detection part 532 decides the start of the next error correction unit data.

Here, the detection method of the start position of the error correction unit data of the start detection part 532 and the detection method of the end position of the error correction unit data of the end detection part 534 may be applied by any method without being limited to the example.

Figure 5:
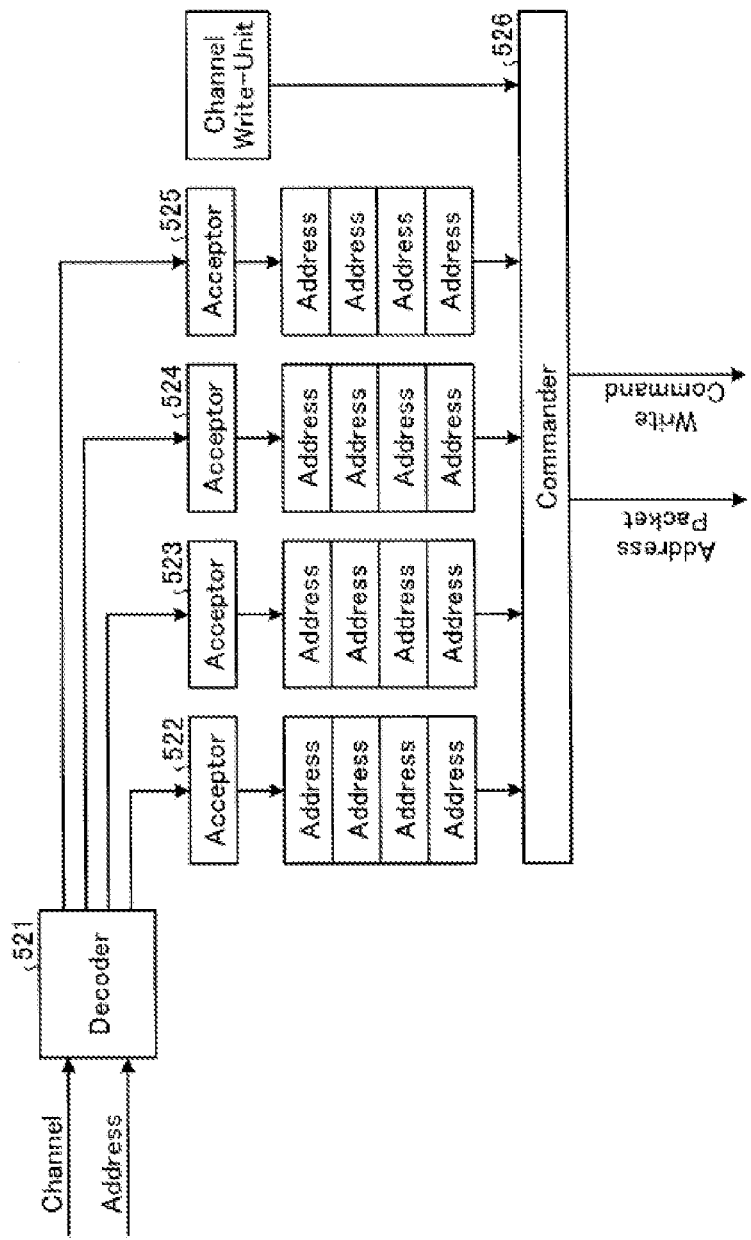
FIG. 5 shows an example of a write command issue part.

FIG. 5 shows an example of the write command issue part 52. As shown in FIG. 5, the write command issue part 52 is provided with a decoding part (decoder) 521, reception processing parts (acceptors) 522 to 525, and command issue part (commander) 526.

The decoding part 521 decodes allocation information, which is input from the channel allocation part 51, decides that a write preparation into the NAND memory 2 has been completed for data corresponding to the allocation information, and notifies the reception processing parts 522 to 525 of the write address corresponding to the write destination channel indicated by the allocation information. The reception processing parts 522, 523, 524, and 525 respectively apply processes corresponding to CH#1, CH#2, CH#3, and CH#4. For example, in case CH#1 is designated as a write destination in the allocation information received from the channel allocation part 51, the decoding part 521 notifies the reception processing part 522 of an address corresponding to CH#1.

The reception processing parts 522 to 525 hold the addresses notified by the decoding part 521 until the number of addresses held thereby reaches a number corresponding to a channel write unit. The channel write processing unit represents the amount of data that the memory controller 1 transfers to the NAND memory 2 at a time for writing one channel. If the number of the held addresses reaches the number corresponding to the channel write unit, the reception processing parts 522 to 525 input the held addresses into the command issue part 526. In the example shown in FIG. 5, a write unit is 16 pages and the channel write unit is 4 pages, and thus four addresses are held for each channel; however the channel write unit is not limited to this example.

Based on the addresses received from the reception processing parts 522 to 525, if the addresses of one write unit are aligned, the command issue part 526 issues a write command corresponding to the write unit along with an address packet (including write destination channel and address).

The channel scheduler 16 reads the write data or ECC data out of the data buffer 18 or ECC buffer 535 based on the write command issued from the command issue part 526, transfers the data to the NAND I/F 17, and writes the data into the NAND memory 2. In other words, the channel scheduler 16 transfers the data at a granularity of a write unit to the NAND I/F 17. At that time, the storage position of the write data in the data buffer 18 and the storage position of the ECC data in the ECC buffer 535 may be notified along with a write command from the channel allocation part 51, or the storage position of the write data in the data buffer 18 and the storage position of the ECC data in the ECC buffer 535 may also be notified from a master control part, etc., not shown in the figures, in the memory controller 1.

In the NAND memory, the write unit generally includes data of several channels. For example, for four channels, 16 pages in total including four pages for each channel are assumed as the write unit. In this embodiment, the write unit may include data of several channels similarly to a normal case, or a write command may be issued to each channel without the write unit including data of several channels. In addition, a write command may also be issued at a granularity of a page unit to each channel (that is, the write unit is assumed as one page).

Moreover, the write unit and the error correction unit may be the same or may be different. FIGS. 6 to 9 show examples of a write data format into the NAND memory 2 of this embodiment (the arrangement of error correction codes). In FIGS. 6 to 9, Host-D indicates host data of one page, and ECC-D indicates ECC data. FIGS. 6 and 7 show examples in which the write unit and the error correction unit are matched. FIG. 6 shows an example in which the write unit and the error correction unit are 8 pages, and FIG. 7 shows an example in which the write unit and the error correction unit are 16 pages. Here, the formats shown in FIG. 6 or 7 may be repeated, and the arrangement of ECC-D in the write unit is not fixed but can be changed.

Figures 9, 10:
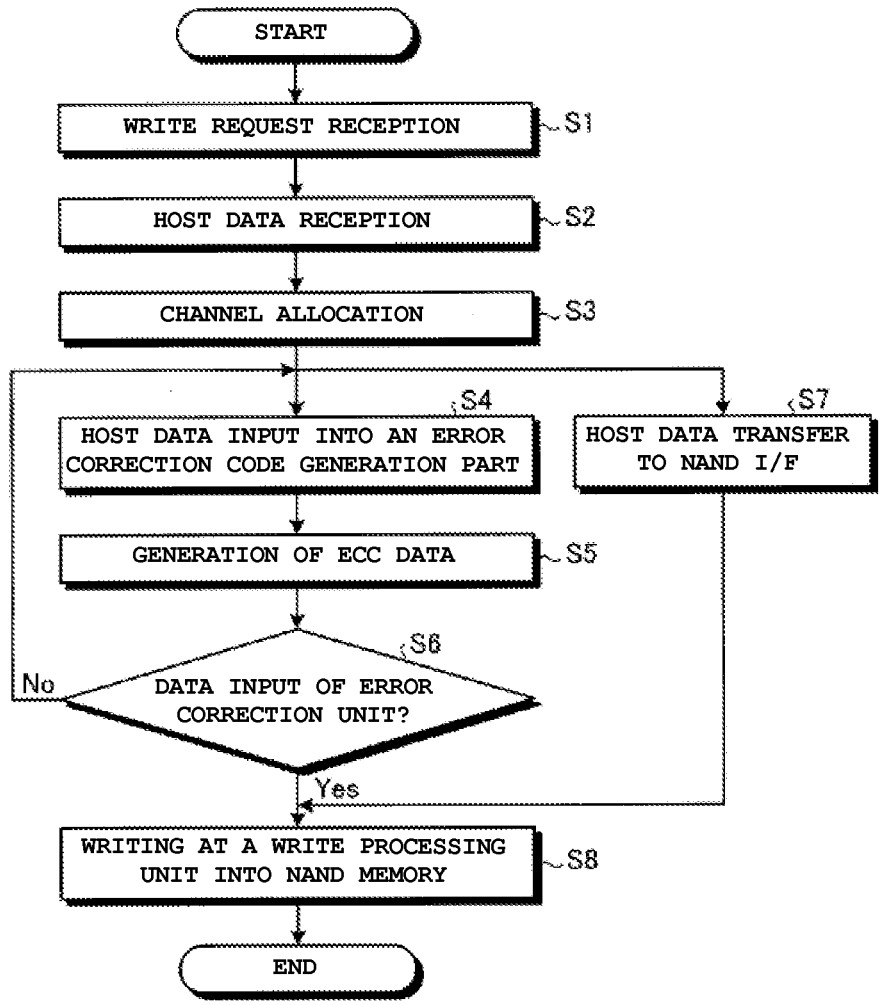
FIG. 9 shows an example of a data format in the case where a write unit is greater than an error correction unit.
FIG. 10 is a flow chart showing an example of a write sequence into a NAND memory.

FIGS. 8 and 9 show examples of a data format in the case where the write unit and the error correction unit are not matched. FIG. 8 shows an example in which the write unit is smaller than the error correction unit, the error correction unit is 8 pages, and the write unit is 4 pages. In the example of FIG. 8, one error correction unit includes two write units U1 and U2. FIG. 9 shows an example in which the write unit is greater than the error correction unit, the error correction unit is 8 pages, and the write unit is 16 pages. Therefore, the error correction unit may be greater or lesser than the write unit; however in this embodiment, when the error correction unit is greater than the write unit, a more efficient write can be applied. In addition, the write unit may also be one page.

Next, a write operation of this embodiment will be explained. FIG. 10 is a flow chart showing an example of a write sequence into the NAND memory 2 in the memory controller 1. Here, for simplicity of explanation, an example in which one error correction unit data is written into the NAND memory 2, is shown, and in this example, the error correction unit is greater than the write unit. First, the write command reception processing part 12 of the memory controller 1 receives a write request (write command) from a host (step S1) and receives host data (write data transmitted from the host) (step S2).

The channel allocation part 51 allocates channels to host data (step S3). In addition, the host data are input into the error correction code generation part 15 (step S4). The error correction code generation part 15 generates ECC data (including an intermediate state) based on the input host data (step S5). Next, the error correction code generation part 15 decides whether or not the amount of data that has been processed is as much as the error correction unit data (step S6). If the amount of data that has been processed is as much as the error correction unit data (step S6, Yes), the generated ECC data are written at a write unit into the NAND memory 2 by the channel scheduler 16 and the NAND I/F 17 (step S8), finishing the write processing. The NAND I/F 17 writes the transferred data into the NAND memory 2 for each channel.

However, if the data is not processed as much as the error correction data (step S6, No), the flow returns to step S4. In addition, after step S3, along with step S4, if the channel scheduler 16 detects the end of the channel allocation to the data at a write unit by receiving the write command from the error correction code generation part 15, the corresponding host data at a write unit are read out of the data buffer 18 and transferred to the NAND I/F 17 (step S7).

In case two or more error correction unit data are written into the NAND memory 2, steps S2 to S8 are repeated.

As explained in this embodiment, the error correction encoding processing and the data transfer to the NAND I/F are carried out in parallel. For this reason the write speed can be improved.

Figure 11:
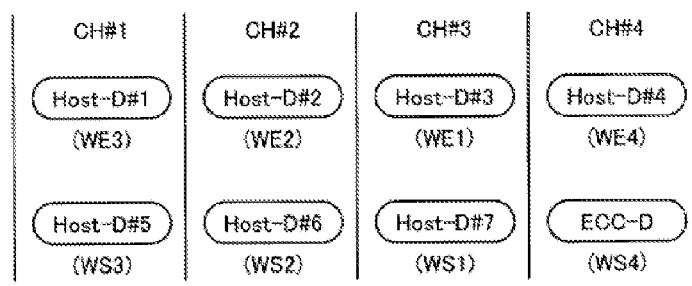
FIG. 11 is a diagram showing an example of the write sequence into a NAND memory.

The effects of this embodiment will be explained with reference to the figures. FIG. 11 shows an example of the write sequence into the NAND memory 2 in the case where the write unit is one page. Host-D#i indicates host data of one page, and i indicates the input sequence into the error correction code generation part 15. In other words, the host data are input into the error correction code generation part 15 in order of Host-D#1, Host-D#2, Host-D#3, etc. (WEj) (j=1, 2, 3, 4) of FIG. 11 shows the end sequence of writing of each host data into the NAND memory 2, and it is shown that the data writing is finished in order of (WE1), (WE2), (WE3), and (WE4). In other words, in the example of FIG. 11, the writing is finished in order of Host-D#3, Host-D#2, Host-D#1, and Host-D#4. In the example of FIG. 11, the error correction unit is 8 pages.

Conventionally, since the input sequence into the error correction encoding processing and the write sequence into the NAND memory 2 are matched, the process waits until all the channels into which the error correction unit data are to be written become vacant, and the channel into which the error correction unit data are to be written is not released until writing of the error correction unit data is finished. Therefore, as shown in FIG. 11, even if the writing is completed in order of Host-D#3, Host-D#2, Host-D#1, and Host-D#4, in the conventional method, writing of CH#3 or CH#2 cannot be applied until CH#1, into which the next write data Host-D#5 are written, is vacant. On the contrary, in this embodiment, if data of a write unit are aligned, since writing into the NAND memory 2 is applied, the next data can be written in order of (WSj) (j=1, 2, 3, 4) of FIG. 11, writing the data at a page unit. In other words, the next data can be written from the channel whose writing has been finished, thus being able to reduce the vacant time of the channel.

Figure 12:
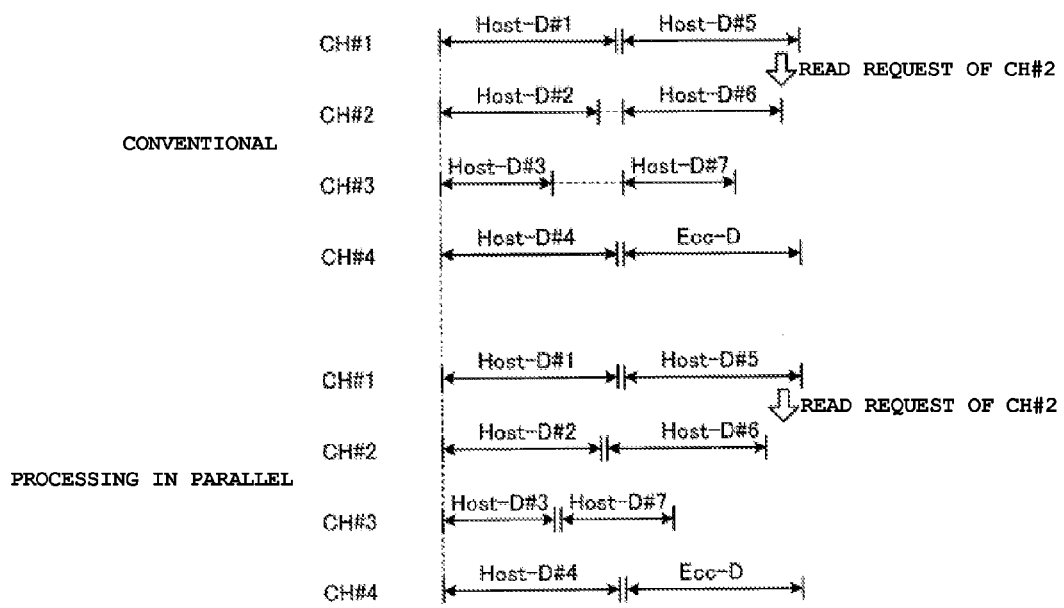
FIG. 12 provides a comparison between a conventional write method and the write method according to the embodiment.

FIG. 12 shows the comparison between a conventional write method and the write method of this embodiment. The upper stage shows the conventional write method, and the lower stage shows the write method of this embodiment. In FIG. 12, it is assumed that writing is carried out in the format shown in FIG. 11 and the writing is finished in order of (WE1), (WE2), (WE3), and (WE4) shown in FIG. 11. As shown in FIG. 12, since the next data are written sequentially from the channel whose writing has been finished, the vacant time can be reduced, compared with the conventional method.

In addition, as shown in FIG. 12, in case a read command for reading the data corresponding to CH#2 is received from the host during writing of these 8 pages, in the conventional method, the read cannot be carried out until writing of all the error correction unit data are finished. On the contrary, in this embodiment, since the vacating timing of CH#2 is faster than that of the conventional method, the read corresponding to the read command can be rapidly carried out, compared with the conventional method.

Here, in FIGS. 11 and 12, an example in which one page is assumed as a writing unit has been shown; however in a data format of the error correction unit data similar to that of FIG. 11, even if the write unit is 4 pages of one page each of four channels, since a read command can be received each time writing of the write unit is finished, the response speed can be improved, compared with the conventional method.

In this embodiment, the data write processing and the error correction encoding processing into the NAND memory 2 have been carried out in parallel. For this reason, the read corresponding to a read command can be rapidly applied, compared with the related art, thus being able to improve the performance of the entire system. In addition, if a write unit is appropriately set, the write speed can be improved, compared with the related art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller for controlling a nonvolatile memory, comprising:
   a memory interface that has multiple channels and carries out writing into the nonvolatile memory through each of the channels;
   a data buffer;
   an ECC (error correcting code) encoder for applying an error correction encoding processing on write data to be written into the nonvolatile memory, thereby generating ECC data;
   a channel allocation part for allocating the channels to the write data and the ECC data based on a write data format of the nonvolatile memory;
   a write data reception processing part that stores the write data in the data buffer and outputs the write data to the ECC encoder;
   a channel scheduler for transferring the write data and the ECC data to the channels of the memory interface as allocated by the channel allocation part, wherein subsequent write data are transferred to each of the channels which has finished carrying out writing of the write data allocated to the channel into the nonvolatile memory without waiting for writing of the corresponding ECC data to finish, such that a period during which the write data is transferred overlaps a period during which error correction encoding processing is applied on the write data; and
   a write command issuing part that (1) specifies a unit size of write data transferred to the memory interface, (2) receives a channel allocation result from the channel allocation part, and (3) issues a write command to instruct the channel scheduler to write the write data, upon determining that processing of write data equal in size to the unit size of the write data has completed,
   wherein the unit size of the write data is smaller than a unit size of error correction data, the error correction data including both the ECC data and the write data corresponding to the ECC data.

2. The memory controller according to claim 1, wherein the write data are distributed to two or more channels.

3. The memory controller according to claim 1, wherein data of the unit size of write data includes data that are written into a single channel.

4. The memory controller according to claim 1, wherein the ECC encoder comprises:
   an ECC buffer for storing the ECC data, and
   a buffer management part that updates information about the ECC buffer in which the ECC data are stored to indicate a vacant area upon being notified that the ECC data have been transferred to the memory interface.

5. The memory controller according to claim 4, wherein the ECC encoder further comprises:
   a start detection part that detects a start position of the write data as a source of the ECC data, and determines a start address in the ECC buffer for storing the ECC data based on the information indicating the vacant area of the ECC buffer;
   an ECC calculation part that (1) receives, as input data, the write data at a prescribed data unit, (2) performs error correction encoding processing using the input data at the start position detected by the start detection part as a start input, (3) stores a result of the error correction encoding processing in the start address of the ECC buffer, (4) updates the ECC buffer by applying the error correction encoding processing each time input data are added thereafter, and (5) updates the value of an encoding counter as the error correction encoding processing is applied to each input data; and
   an end detection part for notifying the channel allocation part of an end of the ECC data generation.

6. The memory controller according to claim 5, wherein, the end of the ECC data generation is detected based on the number of input data as a source of the ECC data and the counter value of the encoding counter, and the channel allocation part allocates the channels to which the ECC generation end has been notified to the ECC data.

7. A memory system comprising:
   a nonvolatile memory;
   a memory interface that has multiple channels and carries out writing into the nonvolatile memory through each of the channels;
   a data buffer;
   an ECC (error correcting code) encoder for applying an error correction encoding processing on write data to be written into the nonvolatile memory, thereby generating ECC data;
   a channel allocation part for allocating the channels to the write data and the ECC data based on a write data format of the nonvolatile memory;
   a write data reception processing part that stores the write data in the data buffer and outputs the write data to the ECC encoder; and
   a channel scheduler for transferring the write data and the ECC data to the channels of the memory interface as allocated by the channel allocation part, wherein subsequent write data are transferred to each of the channels which has finished carrying out writing of the write data allocated to the channel into the nonvolatile memory without waiting for writing of the corresponding ECC data to finish, such that a period during which the write data is transferred overlaps a period during which error correction encoding processing is applied on the write data; and
   a write command issuing part that (1) specifies a unit size of write data that are transferred to the memory interface, (2) receives a channel allocation result from the channel allocation part, and (3) issues a write command to instruct the channel scheduler to write the write data, upon determining that processing of write data equal in size to the unit size of the write data has completed,
   wherein the unit size of the write data is smaller than a unit size of error correction data, the error correction data including both the ECC data and the write data corresponding to the ECC data.

8. The memory system according to claim 7, wherein the write data are distributed to two or more channels.

9. The memory system according to claim 7, wherein data of the unit size of write data includes data that are written into a single channel.

10. The memory system according to claim 7, wherein the ECC encoder comprises:

an ECC buffer for storing the ECC data, and a buffer management part that updates information about the ECC buffer in which the ECC data are stored to indicate a vacant area upon being notified that the ECC data have been transferred to the memory interface.

11. The memory system according to claim 10, wherein the ECC encoder further comprises:

a start detection part that detects a start position of the write data as a source of the ECC data, and determines a start address in the ECC buffer for storing the ECC data based on the information indicating the vacant area of the ECC buffer;

an ECC calculation part that (1) receives, as input data, the write data at a prescribed data unit, (2) performs error correction encoding processing using the input data at the start position detected by the start detection part as a start input, (3) stores a result of the error correction encoding processing in the start address of the ECC buffer, (4) updates the ECC buffer by applying the error correction encoding processing each time input data are added thereafter, and (5) updates the value of an encoding counter as the error correction encoding processing is applied to each input data; and an end detection part for notifying the channel allocation part of an end of the ECC data generation.

12. The memory system according to claim 11, wherein, the end of the ECC data generation is detected based on the number of input data as a source of the ECC data and the counter value of the encoding counter, and the channel allocation part allocates the channels to which the ECC generation end has been notified to the ECC data.

13. A method of writing to a memory system including a nonvolatile memory, which can carry out reading and writing through multiple channels, and an ECC (error correcting code) encoder, the method comprising the steps of:

storing write data, which are to be written into the nonvolatile memory, in a data buffer and supplying the write data into an ECC encoder;

applying an error correction encoding processing on the write data to generate ECC data;

allocating the channels to the write data and the ECC data based on a write data format of the nonvolatile memory;

specifying a unit size of write data transferred to the channels;

issuing a write command to write the write data, upon determining that processing of write data equal in size to the unit size of the write data has completed, wherein the unit size of the write data is smaller than a unit size of error correction data, the error correction data including both the ECC data and the write data corresponding to the ECC data; and transferring the write data stored in the data buffer and the ECC data to the channels as allocated, wherein subsequent write data are transferred to each of the channels which has finished carrying out writing of the write data allocated to the channel into the nonvolatile memory without waiting for writing of the corresponding ECC data to finish, such that a period during which the write data is transferred overlaps a period during which error correction encoding processing is applied on the write data.

14. The method of claim 13, wherein the write data are transferred to two or more channels and the ECC data are transferred to one channel.

* * * * *